United States Patent [19]
Walker

[11] 3,987,474
[45] Oct. 19, 1976

[54] NON-VOLATILE CHARGE STORAGE ELEMENTS AND AN INFORMATION STORAGE APPARATUS EMPLOYING SUCH ELEMENTS

[75] Inventor: Laurence G. Walker, Dover, Mass.

[73] Assignee: Massachusetts Institute of Technology, Cambridge, Mass.

[22] Filed: Jan. 23, 1975

[21] Appl. No.: 543,602

[52] U.S. Cl. .................................. 357/23; 357/30; 307/311; 307/304; 307/238; 357/42; 340/173 R; 340/173 CA
[51] Int. Cl.² .................. H01L 29/78; H01L 27/14
[58] Field of Search ............. 357/23, 30, 4, 42; 307/311, 304, 238; 340/173 R, 173 CA

[56] References Cited
UNITED STATES PATENTS

| | | | |
|---|---|---|---|
| 3,492,548 | 1/1970 | Goodman | 317/235 |
| 3,646,527 | 2/1972 | Wada | 340/173 R |
| 3,653,002 | 3/1972 | Goffee | 340/173 |
| 3,875,567 | 4/1975 | Yamazaki | 340/173 R |
| 3,877,058 | 4/1975 | Cricchi | 357/24 |
| 3,882,469 | 5/1975 | Gosney, Jr. | 340/173 R |
| 3,882,531 | 5/1975 | Michon | 357/24 |
| 3,886,530 | 5/1975 | Huber | 340/173 CR |
| 3,889,287 | 6/1975 | Powell | 357/23 |
| 3,893,151 | 7/1975 | Bosselaar | 357/23 |
| 3,893,152 | 7/1975 | Lin | 357/23 |
| 3,911,464 | 10/1975 | Chang | 357/23 |
| 3,916,268 | 10/1975 | Engeler | 357/23 |
| 3,950,738 | 4/1976 | Hayashi | 340/173 LS |
| 3,952,325 | 4/1976 | Beale | 357/23 |

*Primary Examiner*—Martin H. Edlow
*Attorney, Agent, or Firm*—Arthur A. Smith, Jr.; Robert Shaw; Martin M. Santa

[57] ABSTRACT

A non-volatile charge storage element wherein long-term charge storage occurs in the interface states of the element. Charge is stored at low applied voltages ( $\leq$ 10 volts) in short times ( $\leq$ 1 microseconds) and is stored as long as $10^5$ seconds or longer. The states are emptied by exposure to radiation in the visible or the near infrared regions of the spectrum. There are described, also, an information storage device employing a plurality of such elements and a solid-state camera wherein the image screen includes a plurality of such elements. Changes in the charge storage in each of the elements results in changes in the capacitance of the element; either the capacitance of the element or its charge state is sensed to indicate the state of the element for information storage purposes. In one embodiment, thin film techniques are employed and a change in transconductance is detected to sense the charge state.

32 Claims, 7 Drawing Figures

NON-VOLATILE CHARGE STORAGE ELEMENTS AND AN INFORMATION STORAGE APPARATUS EMPLOYING SUCH ELEMENTS

The invention herein described was made in the course of work under a contract of the Department of the Army, Army Research Office - Durham, an agency of the United States Government.

The present invention relates to non-volatile charge storage elements and to information storage apparatus employing such elements.

There accompanies herewith a copy of an article entitled "Long Term Charge Storage in Interface States of ZnS MOS Capacitors", authored by the present inventor and another; and published in the Journal of Applied Physics, Vol. 46, No. 7, July 1975, pp. 2992–2997. The article contains a detailed analysis of the concepts hereinafter described, including a mathematical treatment of the subject, a great deal of which is not duplicated here. Said article is incorporated herein by reference.

Non-volatile semiconductor memories combine the packing density and low-cost advantages of semiconductor memories with the non-volatility of magnetic memories. Such non-volatile memories have been heretofore proposed and produced: see J. Appl. Phys. 40, 3307 (Frohman-Bentchkowsky et al, 1969); IEEE Trans. Electron Devices ED-19, 1280 (White et al, 1972); Sol. St. Elect. 17, 517 (Frohman - Bentchowsky, 1974); and IEEE J. Sol. St. Circ., SC7, 369 (Tarni et al, 1972). The proposed memories employ Si substrates wherein the memory is effected by storage of charge in states at or near the dielectric interface (Frohman-Bentchkowsky et al, 1969 and White et al, 1972); or in floating gates (Frohman-Bentchowsky, 1974 and Torni et al). Minimum writing times for the memory elements are 0.1 and 1.0 microseconds, respectively. The dielectric interface devices are able to achieve low writing voltages only when the oxide thickness is of the order of 25 A. The reproducibility of the thin oxide films, however, constitutes a major fabrication problem. The floating gate devices require large writing voltages ($> \sim 30$ volts). Both types of device exhibit excellent long-term charge storage (typically less than 40 percent and 10 percent loss in $10^6$ seconds, respectively), even at room temperature. Erasure of stored information is achieved electrically for the dielectric interface devices, time and bias magnitude being approximately the same as for writing, and by irradiation with x-ray or ultraviolet light for the floating gate devices. Reading in either case is non-destructive.

An object of the present invention is to provide a non-volatile memory element, that can be quickly erased by irradiation, one that has low writing voltages, and one that can be read non-destructively.

A further object is to provide a memory which can be produced economically using well-developed available techniques.

Another object is to provide a solid-state camera.

The foregoing and further objects are noted hereinafter and are particularly delineated in the appended claims.

The foregoing objects are achieved in a non-volatile charge storage element composed of a wide-gap semiconductor substrate, a thick ($\geq 200A$) insulating layer on the substrate, and a metal layer on the insulating layer such that the insulating layer is sandwiched between the substrate and the metal layer. The objects are further achieved in information storage apparatus embodying a plurality of such elements.

The invention is hereinafter described with reference to the accompanying drawing in which.

Figure 1:
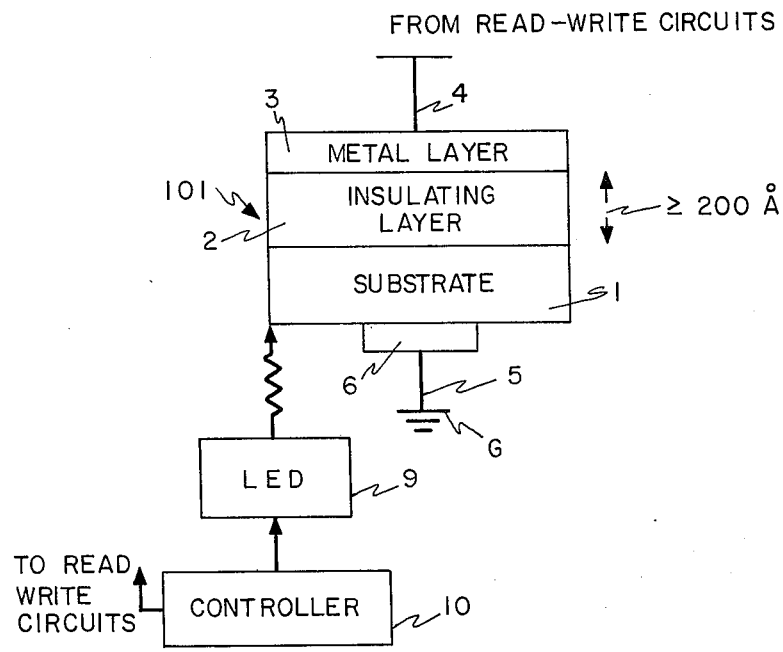
FIG. 1 is a side diagrammatic view of a memory element embodying the present concepts, said element being one that has a ground state and a memory state which are distinguished from one another in terms of the capacitance or charge state of the element.

Turning now to FIG. 1, a non-volatile charge storage element is shown at 101 comprising a wide-gap semiconductor material forming a substrate 1, a thick insulating layer 2 (e.g., $SiO_2$, $Si_3N_4$) on the substrate 1, and a metal layer 3 on the oxide (or other insulating) layer 2 such that the oxide layer is sandwiched between the substrate and the metal layer, as shown. The material of which the oxide layer consists must have a wider energy gap than that of the semiconductor material of the substrate. The oxide layer 2 is at least the order of 200A thick and, indeed, in the device reported upon in said article the layer 2 is 2520A thick. Typically, the semiconductor material of the substrate has a conductivity of at least the order of $10^{-4}$ mhos/cm and has a gap at least the order of two electron volts; typically, the insulating layer 2 consists of a material having a conductivity no greater than $10^{-4}$ mhos/cm (and usually much lower than $10^{-4}$ mhos/cm) and a band gap at least the order of 3 electron volts (and usually 6 to 10 electron volts).

Figure 3:
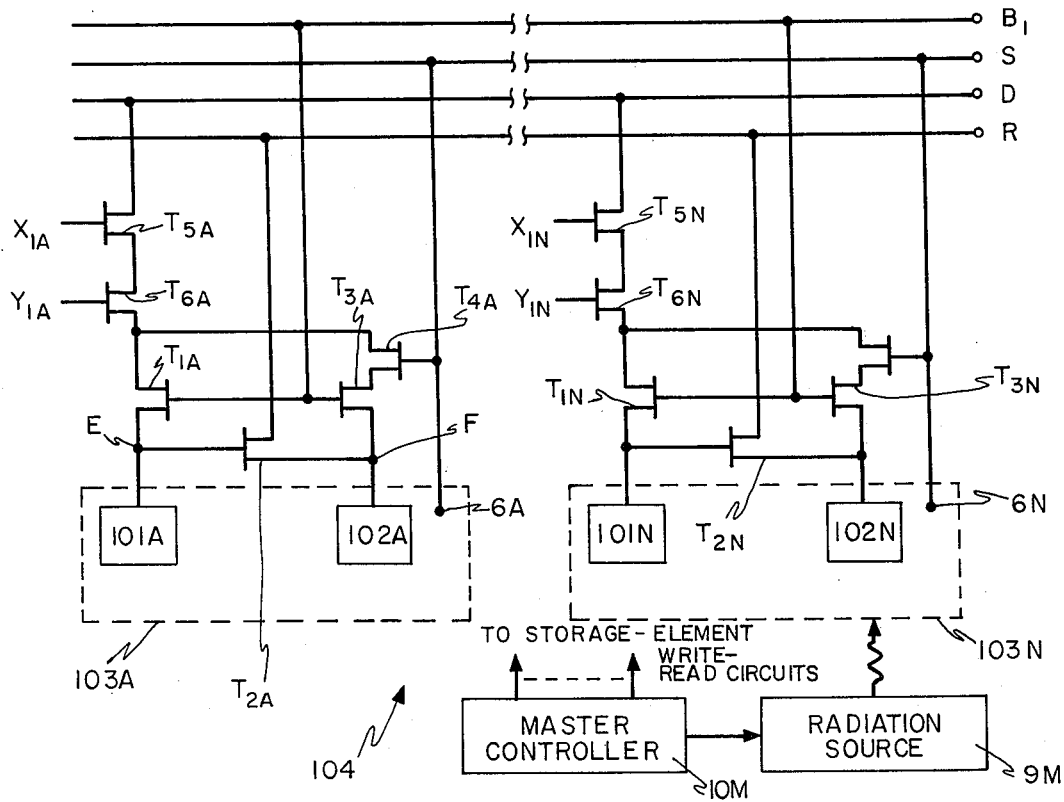
FIG. 3 is a circuit diagram of a small part of an information storage device employing a plurality of memory elements of the type shown in FIG. 1.
Figure 2:
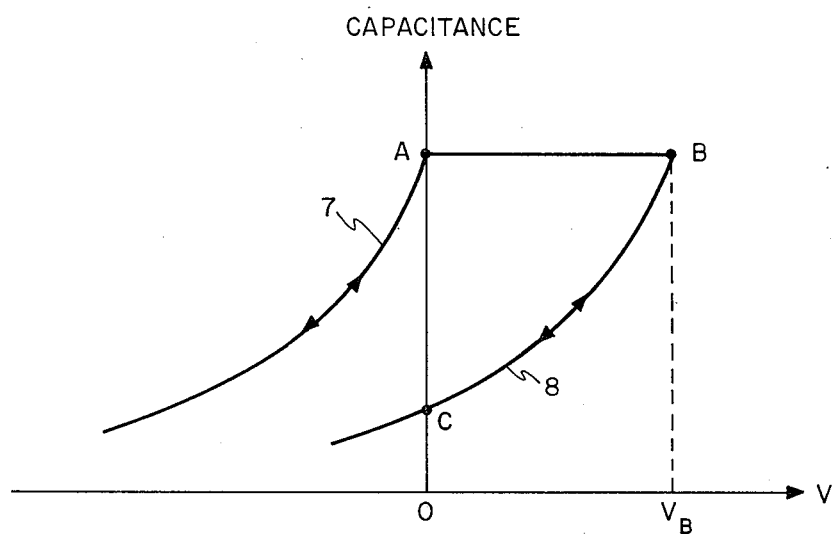
FIG. 2 shows changes in capacitance of the element of FIG. 1 from the ground state to the memory state.

The storage element 101 can be charged by applying a low voltage pulse ($\leq 10$ volts) between leads 4 and 5, the former being electrically connected to the metal layer 3 and the latter through an ohmic contact 6 to the substrate 1. Charging can be accomplished in less than a microsecond and such charge has been observed to be retained for as long as $10^5$ seconds. While the charge storage mechanism need not be explained, a detailed analysis is made in said article and that analysis shows that storage is most likely in the interface states between the oxide layer 2 and the semiconductor substrate 1. Changes in the charge storage in the element 101 results in changes in the capacitance of the element as shown in FIG. 2 wherein the capacitance-voltage curve labeled 7 depicts the relationship in the original or uncharged state, and the capacitance-voltage relationship curve labeled 8 depicts the relationship in the charged state. The shift between the curves 7 and 8 is approximately equal to $V_B$, the applied forward bias. The storage element 101 is originally at the capacitance value labeled A; a forward bias $V_B$ moves it to point B and, when the bias is removed, it moves to point C. It will then slowly relax from point C to point A (in a time period of $10^5$ seconds or more). The change in capacitance can be sensed as hereinafter explained, and such change can serve as a basis for information storage in a digital computer system, but the changes can provide storage information for an analog system as well. If the storage element 101 when in the charged state (point C in FIG. 2) is subjected to radiation in the visible or near infrared region of the electromagnetic spectrum, the stored charges will relax quickly to the original or uncharged state (i.e., point A). Such radiation can be provided by a light emitting diode 9 under the direction of a controller 10. It should be appreciated that the controller 10 can be a master controller that provides the signal input pulse to the storage element 101 as well as the LED 9, as shown in FIG. 3. Further, in a computer system, many storage elements 101 and associated circuits can be grown on a small chip; such elements can be provided with information for storage in microseconds; and the erase function of all the storage elements can be accomplished by applying an electric pulse to the LED 9.

The write, read and erase functions for an N-element matrix are now explained with reference to FIG. 3 which shows a system 104 comprising information storage elements 101A . . . 101N (like the element 101) and reference elements 102A . . . 102N (also like the element 101). The two elements 101A and 101N are part of a matrix that, in practical memory systems, contains many such storage elements, as is well known. A charge can be applied to a storage element by applying a voltage pulse thereto, as above explained, and the particular element to which such pulse is applied is chosen using developed matrix techniques. The write function as to the element 101A, for example, is performed in this way: a positive voltage pulse $V_A$ is applied to the line designated $B_1$, thereby turning on transistors $T_{1A}$ and $T_{3A}$; and the positive voltage $V_A$ is applied, at the same time, to access lines $X_{1A}$ and $Y_{1A}$ to turn on transistors $T_{5A}$ and $T_{6A}$. At this juncture the element 101A is connected to input line D. The input line marked S is connected to ohmic contacts 6A . . . 6N which are the equivalent of the contact 6 in FIG. 1, and represent merely a common connection to the various storage elements. (The various circuit members in FIG. 3, except the members designated master controller 10A and radiation source 9A, of course, can be grown on, say, a one cm square chip, on which ZnS islands form the substrate of the sandwich structure of FIG. 1.) The positive pulse $V_A$ is now applied to the input line D, charging the storage element 101A, but not the element 102A since the transistor shown at $T_{4A}$ is OFF. The write function is now complete as to the element 101A: power to the memory in FIG. 3 can now be removed and the information will remain. Similar steps can be performed to charge the storage elements . . . 101N.

The read function involves comparing the capacitance on a respective storage element 101A . . . with that of an associated reference element 102A . . . . Specifically, the charge state of the storage element 101A is compared with the reference element 102A, in the manner now explained, to determine the state of the element 101A. A moderate positive voltage $V_C$ ($V_C < V_A$) is applied to the line $B_1$: in this situation the transistors $T_{1A}$ and $T_{3A}$ act as resistors with moderate values of conductance. The positive voltage pulse $V_A$ is applied to the input line shown at S; then the positive voltage pulse $V_A$ is applied to the input line D and to the lines $X_{1A}$ and $Y_{1A}$ to select the storage element to be read. At this juncture both the storage element 101A and the reference element 102A are connected to the line D through the resistances provided by the field effect transistors $T_{1A}$ and $T_{3A}$. A negative voltage is applied to the line shown at R; a negative pulse is superimposed upon the positive voltage on the line D. Now, if the capacitances of both of the elements 101A and 102A are the same (i.e., both elements are in the same state), the voltage on each of the elements 101A and 102A will have the same time dependence and no voltage will appear between points E and F in FIG. 3. If, on the other hand, the element 101A is in the charged condition, the voltage on the two elements 101A and 102A will have different time dependences and a potential difference will occur between the points E and F. With no potential between the points E and F, the transistor $T_{2A}$ will be OFF, but when there is a potential between the two points, the transistor $T_{2A}$ turns ON and a current pulse flows in the line R. Hence, the current in the line R can be monitored to provide non-destructive read operations in the system 104.

Once the read function has been performed the element can be erased by irradiation, as previously discussed. The write and read function as to the storage elements . . . 101N are similarly effected. The reset function is performed by irradiating the storage elements 101A . . . 101N by one or more LEDs, as before. It will be appreciated by workers in the art that the many storage elements 101A . . . 101N and 102A . . . 102N can be formed on a single chip, perhaps one centimeter square, which can be reset by a single LED, and many such chips can be employed in a large computer memory having many millions-bit capacity.

The various logical operations and various pulses and sensors necessary to effect the foregoing functions are provided by and in a master controller 10M which controls, as well, a radiation source 9M for erase purposes. It is not believed that any further explanation of the master controller is needed in the well-developed computer art to which the present specification is directed.

Figure 4:
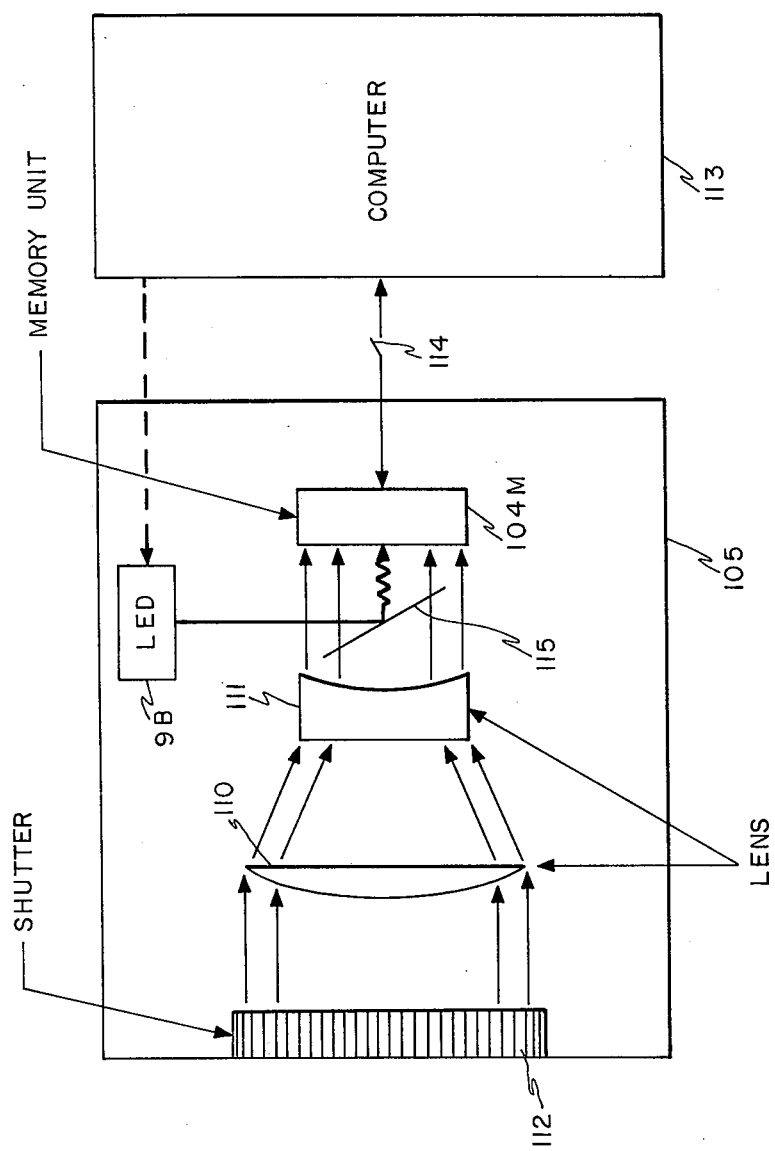
FIG. 4 is a side view, diagrammatic representation, partly block diagram in form, of a solid-state camera that has an image screen device that includes a plurality of memory elements like the element in FIG. 1, but grown on a single chip.

The storage elements 101A . . . 101N can be employed in a solidstate camera such as that shown schematically at 105 in FIG. 4. The camera 105 comprises a visible-image storage device 104M that comprises (see FIG. 5) a plurality of storage elements, designated $101A_1$ . . . $101N_1$; each of the elements $101A_1$, etc., like the elements 101A etc., is a sandwich structure similar to that shown in FIG. 1. The visible-image storage device 104M is located at the image plane of the camera that further includes lenses 110 and 111, and a shutter 112. A computer 113 is connected through a switch 114 to the camera 105. It is to be appreciated that the computer 113 performs many of the functions of the master controller 10M and other functions as well. Since the storage device 104M has a long-term memory, it need not be read immediately. Thus, in FIG. 4 there is shown the switch 114 between the camera 105 and the computer merely to show that an image can be formed on the device 104M, stored there and later transferred to the computer. Of course, in this circumstance, appropriate electronics to perform many of the functions hereinafter discussed with reference to FIG. 5, would be installed within the block 105. Also, the camera 105 can be reset merely by pulsing the line L described below in connection with FIG. 5. Additional comments relative to solid-state cameras, generally, are contained in U.S. Pat. No. 3,705,391 (Baker).

Figure 5:
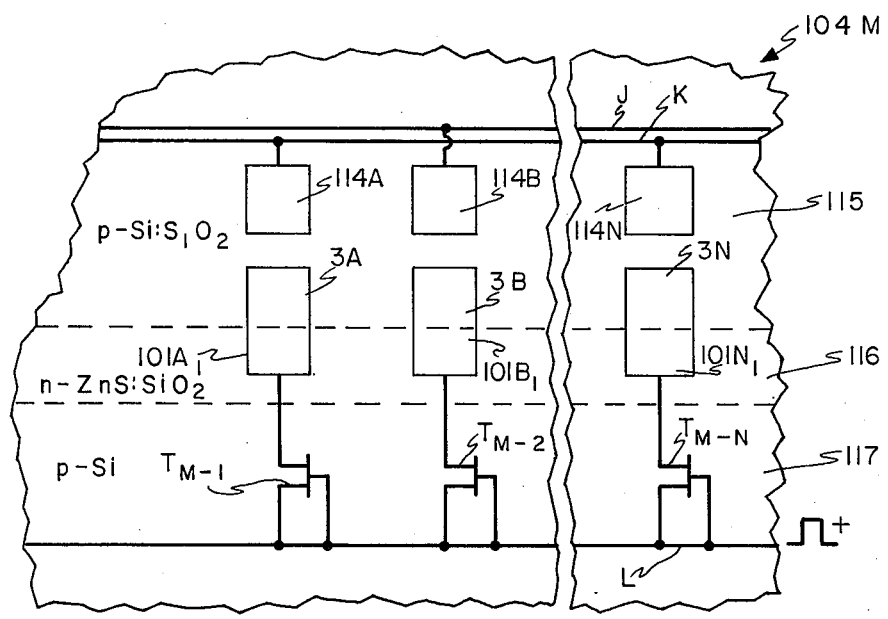
FIG. 5 is a plan view showing, in schematic form, a portion of the image screen in FIG. 4.

In FIG. 5 there is shown a single row of storage elements. Preliminarily it should be noted that a single row can be employed to receive an image which, as herein explained, can be sent to the computer 113 for storage. Also, the explanation with regard to the operation of a single row applies to multiple rows as well. It suffices to note, however that if an image is to be recorded and stored, then many rows of storage elements are required in the storage device 104M.

The storage device 104M again can be a chip that has grown thereon all the elements shown diagrammatically in FIG. 5. The basic chip in the illustrative example herein is silicon wherein substrates of p—Si: $SiO_2$, n—ZnS:$SiO_2$ and p—Si designated 115, 116, and 117, respectively, are formed. Conductors J, K and L, transistors $T_{M-1}$, $T_{M-2}$, ... $T_{M-N}$, etc., are all formed on the chip. The storage elements $101A_1$, $101B_1$ ... $101N_1$ have metal layers 3A, 3B ...3N, respectively, like the metal layer 3 above-described. The metal layers 3A, etc., perform a function here in addition to the function of the layer 3, as explained in the next paragraph. It should be noted here that the parts of the elements $101A_1$, etc., are all in the n-ZnS:$SiO_2$ substrate 116 except for the metal layers 3A, etc., which extend onto the substrate 115 and are capacitively coupled with metal plates 114A, etc., respectively.

The substrates 115, 116 and 117 are connected to a common connection (not shown) and to a source of pulses which can be in the computer 113, but need not be. To record an image on the storage device 104M, a positive voltage pulse is applied to the line L, causing the transistors $T_{M-1}$, $T_{M-2}$ ... $T_{M-N}$ to be conductive: the positive pulse is thus applied to the array of storage elements $101A_1$, $101B_1$ ... $101N_1$ charging them, as before. The array is exposed to an image, thereby causing the individual elements $101A_1$ ... to dump charge in proportion to the incident light on each and thereby store the image on the device 104M in long-term storage states. The array draws no power in the exposure step.

To transfer the image from storage to the computer, the array of storage elements is exposed by a radiation pulse from an LED 9B (see FIG. 4) in the camera; the exposure empties the states and causes a voltage to appear on the plates 3A, 3B ... 3N proportional to the charge of the respective storage element $101A_1$, $101B_1$ ... $101N_1$. Also the pulsed radiation creates pairs in the p-Si substrate 117 and the electrons from the pairs concentrate under the common plates 114A, etc., again in an amount dependent upon the initial stored intensity. Soon after the light pulse and before electrons in the p-Si substrate 117 recombine, the lines J and K are pulsed to attract the electrons to the respective plates 114B ... and 114A ... 114N, respectively, (i.e., to the plates connected to the respective line). The lines J and K are pulsed in standard two-phase CCD operation to shift the image information from the array of storage elements to the computer 113. (The LED 9B is controlled by the computer 113, light being directed to the device 104 by a half-silvered mirror 115).

Figure 6:
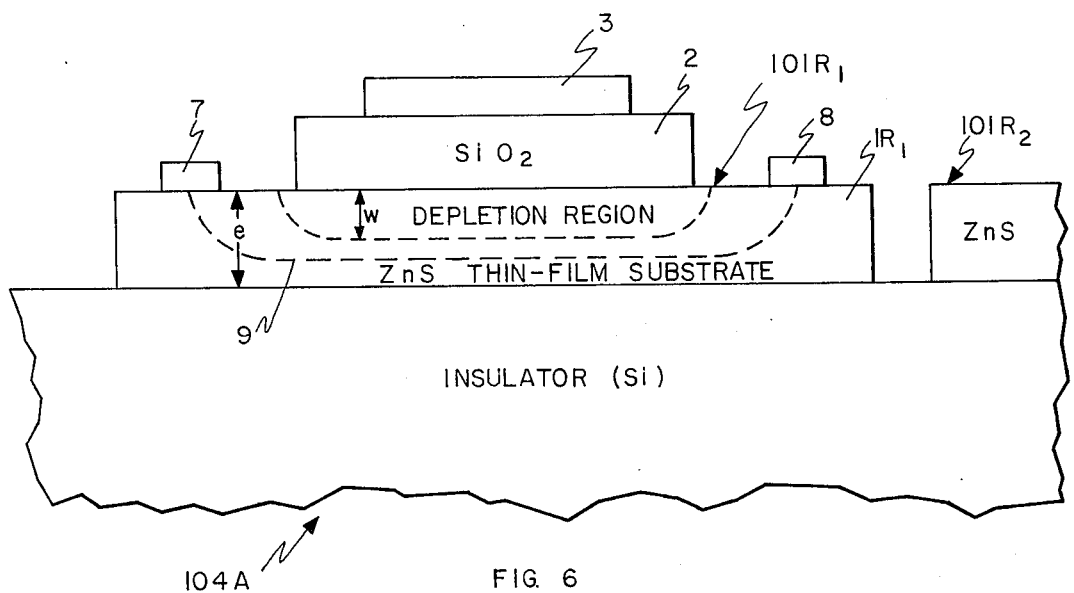
FIG. 6 is a side diagrammatic view of a memory array that includes a plurality of memory elements on an insulator that acts as a mechanical support.

The information storage system or device marked 104A in FIG. 6 comprises a plurality of elements $101R_1, 101R_2, \ldots$, like the element 101 in that each has a stable state and at least one quasistable state. The parts 2 and 3 can be identical to the similarly labeled parts in FIG. 1 and serve the same purpose here. The substrate labeled here $1R_1$ however is a thin-film substrate and there are ohmic contacts 7 and 8 at either side of the oxide layer (or other insulating layer) 2. An electric potential applied between the ohmic contacts 7 and 8 will cause current to flow along a path indicated by the dotted line 9 and the conductance of that path is what is affected here, as now explained.

The thin film substrate $1R_1$ has a thickness e that is greater than the unbiased depth W of the depletion layer as shown (the width of the film $101R_1$ into the paper is no greater than oxide layer $1R_1$). If the storage element $101R_1$ is charged in the manner previously discussed, the width W of the depletion layer will increase, thereby changing the transconductance of the element $101R_1$, between the ohmic contacts 7 and 8, and this transconductance can be sensed to note the change in charge storage in said element $101R_1$. A sensing circuit is now discussed with references to FIG. 7.

Figure 7:
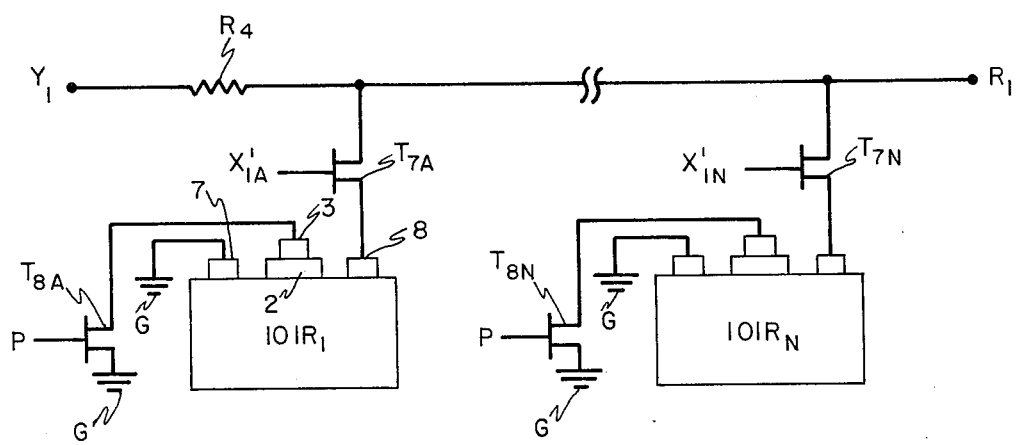
FIG. 7 is a circuit diagram of a small part of an information storage device employing a plurality of memory elements like the memory elements of FIG. 6.

In FIG. 7 two storage elements $101R_1$ and $101R_N$ are shown to represent an N-stage device. A single row of a multirow device is shown. With respect now to the element $101R_1$ in FIG. 7, writing can be effected by applying a negative pulse at the $Y_1$, at $X'_{1A}$ and at P (which is common to all the cells $101R_1 \ldots 101R_N$): this causes a positive voltage to appear between the metal layer 3 and the ohmic contact 8, charging the device, as before. To read the element $101R_1$, a negative voltage is applied at $Y_1$ and $X'_{1A}$. At this juncture, if the element $101R_1$ is charged, the conductance of the conducting path between ohmic contacts 7 and 8 is at a low value and the voltage at a point $R_1$ is about equal to the voltage applied at $Y_1$; if, on the other hand, the element $101R_1$ is not charged, the conductance of said path will be high and current will flow, causing the voltage at the point $R_1$ to be about equal to zero due to voltage drop across a resistor $R_4$.

The film substrate $1R_1$ can be ~ 5000 A thick; the ZnS substrates are supported and grown on an insulator (e.g., Si). The various transistors can be formed at other regions of the insulator.

Further modifications of the present invention will occur to persons skilled in the art, and all such modifications are deemed to be within the spirit and scope of the invention as defined by the appended claims.

What is claimed is:

1. A non-volatile charge storage element, that comprises, a wide-gap semiconductor material forming a substrate, a thick insulating layer on the substrate, and a metal layer on the insulating layer such that the insulating layer is sandwiched between the substrate and the metal layer, the band gap of the semiconductor material being at least the order of two electron volts.

2. A storage element as claimed in claim 1 in which the insulating layer is at least the order of 200A thick.

3. A storage element as claimed in claim 2 in which the wide-gap semiconductor material is ZnS.

4. A storage element as claimed in claim 2 in which said insulating layer is a material that has a wider energy gap than the energy gap of the semiconductor material.

5. A storage element as claimed in claim 4 in which said insulating layer is $SiO_2$.

6. A storage element as claimed in claim 1 in which the semiconductor material has a conductivity of at least the order $10^{-4}$ mhos/cm.

7. A storage element as claimed in claim 1 in which the substrate is a thin film substrate and that includes two ohmic contacts to provide lateral current flow through the thin film from one ohmic contact to the other, there being a depletion layer along the path of current flow, which depletion layer widens upon storage of charge in the element so as to effect a change in the transconductance of the thin film between the two ohmic contacts.

8. A system that comprises a plurality of the storage elements of claim 7 to provide a storage device.

9. A storage element as claimed in claim 1 having an ohmic contact on the semiconductor substrate.

10. Apparatus that includes an element as claimed in claim 9 and a source of electric potential connected to apply a pulse between the metal layer and the ohmic contact to store charge at or near the semiconductor-insulating-layer interface, thereby to change the capacitance of the device over a broad range of bias voltages.

11. A storage element as claimed in claim 4 in which the gap of the semiconductor material is at least the order of 2 electron volts and in which the insulating layer is a single homogeneous material layer having a band gap at least the order of 3 electron volts, the semiconductor material substrate being in direct contact with one surface of the insulating layer and the metal layer being in direct contact with the other surface of the insulating layer.

12. A storage element as claimed in claim 4 wherein the gap of the material forming the insulating layer is in the range of 6 to 10 electron volts.

13. A storage element as claimed in claim 11 wherein the material forming the insulator has a conductivity no greater than $10^{-4}$ mhos/cm.

14. Apparatus as claimed in claim 10 wherein the element is sensitive to radiation in the visible and infrared region of the electromagnetic spectrum and relaxes from a charged state to an uncharged state when subjected to such radiation above some threshold or photon level, which apparatus includes means to subject the element to radiation above said threshold of photon level, selectively, to effect relaxation of the charge.

15. A system as claimed in claim 8 that further includes means for sensing any change in the transconductance of individual storage elements.

16. An information storage device comprising a plurality of individual elements, each element having a stable state and at least one quasi-stable state, means for applying an electric potential to each element, which electric potential operates to change the state of said element from the stable state to said at least one quasi-stable state, there being a change in the capacitance of said element over a broad range of bias voltages from the stable state to the quasi-stable state, and means for sensing the change in capacitance thereby to sense the state of said element, each said element being a non-volatile charge storage element comprising a wide-gap semiconductor material substrate, a thick insulating layer on the substrate, and a metal layer on the insulating layer such that the insulating layer is sandwiched between the substrate and the metal layer, the band gap of the semiconductor material being at least the order of 2 electron volts.

17. An information storage device as claimed in claim 12 in which the insulating layer is at least 200A thick and in which the insulating layer is composed of a material that has a wider energy gap than the energy gap of the semiconductor material.

18. An information storage device as claimed in claim 17 that further includes means for restoring said element from the quasi-stable state to the stable state.

19. An information storage device as claimed in claim 18 in which said elements are sensitive to light and change from the quasi-stable state to the stable state in the presence of light above some threshold of photon energy and in which said means for restoring is a source of light adapted to irradiate said plurality of elements.

20. An information storage device as claimed in claim 19 in which each element has an ohmic contact to the semiconductor substrate, electrical connections to the element being made between the metal layer and the ohmic contact.

21. An information storage device as claimed in claim 16 in which said means for applying an electric potential comprises first transistor means operable to access a particular element in the device and in which said means for sensing comprises second transistor means.

22. A device as claimed in claim 19 in which the light is in the visible region of the electromagnetic spectrum.

23. A device as claimed in claim 19 in which the light is in the infrared region of the electromagnetic spectrum.

24. An information storage device comprising a plurality of individual elements, each element having a stable state and at least one quasi-stable state, means for applying an electric potential to each element, which electric potential acts to change the state of said element from the stable state to said at least one quasi-stable state, there being a change in the transconductance of said element from the stable state to the quasi-stable state, means for sensing the change in said transconductance thereby to sense the state of said element, each said element being sensitive to light such that each will change from the quasi-stable state to the stable state in the presence of light in the visible and the infrared region of the electromagnetic spectrum, and means to subject said elements to such light.

25. An information storage device as claimed in claim 24 in which each said element is a non-volatile charge storage element comprising a thin-film, wide-gap semiconductor material substrate, a thick insulating layer on the substrate, and a metal layer on the insulating layer such that the insulating layer is sandwiched between the substrate and the metal layer, each element further including two ohmic contacts positioned to provide lateral current flow through the thin film from one ohmic contact to the other, there being a depletion layer along the path of current flow, which depletion layer widens upon storage of charge in the element to effect a change in the transconductance of the thin film between the two ohmic contacts.

26. An information storage device as claimed in claim 25 in which the insulating layer is at least 200A thick and in which the insulating layer is composed of a material that has a wider energy gap than the energy gap of the semiconductor material.

27. An information storage device as claimed in claim 25 that further includes means for restoring said element from the quasi-stable state to the stable state.

28. An information storage device as claimed in claim 27 in which said elements are sensitive to light and change from the quasi-stable state to the stable state in the presence of light above some threshold of photon energy and in which said means for restoring is a source of light adapted to irradiate said plurality of elements.

29. An information storage device as claimed in claim 25 in which the insulating layer is a material taken from the group consisting essentially of $Si_2O_2$, $Al_2O_3$ and $Si_3N_4$.

30. A non-volatile charge storage element, that comprises, wide-gap semiconductor material means forming a substrate, thick insulating layer means formed on the substrate and a metal layer formed on the insulating layer means such that the insulating layer means is sandwiched between the semiconducting material means and the metal layer, charge storage occurring in the interface states of the element between the semiconductor material means and the insulating layer means.

31. Apparatus as claimed in claim 30 in which charge storage is effected by applying a low voltage pulse between the substrate and the metal layer and which includes means to apply said pulse.

32. Apparatus as claimed in claim 31 wherein the element is sensitive to radiation and relaxes from a charged state to an uncharged state when subjected to such radiation above some threshold of photon level, which apparatus includes means to subject the element to radiation above said threshold or photon level to effect relaxation from the charged state to the uncharged state.

* * * * *